United States Patent [19]

Nonogaki et al.

[11] 4,269,918

[45] May 26, 1981

[54] PROCESS FOR FORMING PATTERNWISE COATED POWDER LAYER

[75] Inventors: Saburo Nonogaki; Hajime Morishita, both of Tokyo; Shoichi Uchino, Hachioji; Toshikatsu Manabe, Ome, all of Japan

[73] Assignee: Hitachi, Ltd., Tokyo, Japan

[21] Appl. No.: 63,474

[22] Filed: Aug. 3, 1979

[30] Foreign Application Priority Data

Aug. 30, 1978 [JP] Japan .................. 53-104916

[51] Int. Cl.$^3$ .............................................. G03C 5/34
[52] U.S. Cl. ..................................... 430/28; 430/144; 430/291
[58] Field of Search ............... 427/68, 71, 157, 197, 427/199; 430/28, 144, 291

[56] References Cited

U.S. PATENT DOCUMENTS

| | | | |
|---|---|---|---|
| 2,854,348 | 9/1958 | Bowerman | 427/68 |
| 3,472,672 | 10/1969 | Prazak et al. | 427/68 |

FOREIGN PATENT DOCUMENTS

| | | | |
|---|---|---|---|
| 109774 | 2/1940 | Australia | 430/144 |
| 248003 | 11/1963 | Australia | 427/68 |
| 7803907 | 10/1978 | Netherlands | 430/144 |
| 1103864 | 2/1968 | United Kingdom | 430/144 |
| 1103865 | 2/1968 | United Kingdom | |
| 1105112 | 3/1968 | United Kingdom | 430/144 |

*Primary Examiner*—Evan K. Lawrence
*Attorney, Agent, or Firm*—Craig and Antonelli

[57] ABSTRACT

A strongly fixed patternwise coated powder layer is formed on a substrate by subjecting a thin layer of photo-sensitive composition containing an aromatic diazonium salt as a photo-sensitive component capable of becoming sticky due to the formation of a photolytic reaction product of the salt by a patternwise light exposure, thereby making the light-exposed part of the thin layer sticky, bringing the thin layer in contact with powdery grains, thereby forming a powder-containing coating layer, and contacting the powder-containing coating layer with a powdery material that reacts with the photolytic product, thereby forming a water-insoluble or slightly water-soluble solid material to fix the powdery grains to the substrate.

16 Claims, 8 Drawing Figures

PROCESS FOR FORMING PATTERNWISE COATED POWDER LAYER

BACKGROUND OF THE INVENTION

This invention relates to a process for forming a patternwise coated powder layer, and more particularly to an improved process for forming a stable patternwise coated powder layer as in the phosphor screen of a color picture tube where the phosphor is a powdery material.

Three kinds of phosphors each emitting red, green or blue light are dot-wise or stripe-wise coated on the inside surface of a face plate for color picture tube. According to the conventional process, the phosphor coating layer is formed as follows: first of all, a phosphor layer of a first color, for example, a layer of a mixture of green light-emitting phosphor and a photo-sensitive resin, is formed on the inside surface of the face plate. As the photo-sensitive resin, a mixture of polyvinyl alcohol and ammonium bichromate is usually used. The layer is formed usually by applying a mixture of a photo-sensitive resin solution and the phosphor to the inside surface of the face plate, and then drying the applied mixture. Then, the layer is exposed to ultra-violet rays through apertures of a shadow mask. The ultra-violet-irradiated position corresponds to an incident area of election beams for exciting the phosphor, that is, the position to which the phosphor is to be fixed. The photo-sensitive resin at the exposed area becomes insoluble and the whole layer at the area becomes insoluble thereby. Then, the layer is washed with a solvent, usually water, and only the part of layer which has become insoluble by exposure to the ultraviolet rays remains on the face plate, while other part of layer is dissolved off. Then, a layer of phosphor of a second color is formed by using, for example a mixture of blue light-emitting phosphor and the photo-sensitive resin in the same manner as above, and further a layer of phosphor of a third color is formed by using, for example, a mixture of red light-emitting phosphor and the light-sensitive resin in the same manner as above.

As is evident from the foregoing description, a process for preparing a phosphor screen of color picture tube is complicated, and many repetitions of wet application, water washing and drying are required. Thus, simplification of the process has been keenly desired.

The present inventors proposed a process for forming a phosphor screen for color picture tube through more simplified steps than before (Japanese Laid-open Patent Application No. 53-126861; corresponding U.S. patent application Ser. No. 895,372; and corresponding DOS 2,815,894, which is based and established on a new finding that a photolytic product of an aromatic diazonium salt has an ability to accept powdery grains. The proposed process is to form a patternwise coated powder layer on a substrate surface, and is characterized by (1) a first step of applying a thin layer of an aromatic diazonium salt or a photo-sensitive composition containing an aromatic diazonium salt as a photo-sensitive component capable of becoming sticky by light exposure to a substrate surface, (2) a second step of subjecting the thin layer to a patternwise light exposure, thereby making the light-exposed part sticky, and (3) a third step of bringing the light-exposed thin layer in contact with powdery grains, thereby making the thin layer accept the powdery grains according to an ability of the thin layer to accept the powdery grains.

In the production of phosphor screen of color picture tube, said second step and third step are repeated for the phosphors of second and third colors to form a phosphor pattern of three colors.

However, the coated powder layers formed according to such a process are not mechanically strong, and can be relatively easily peeled off from the coated substrate especially by water washing. This is because deliquescent zinc chloride, etc., formed by photolytic reaction of photo-sensitive sticky material (aromatic diazonium salt), is contained as a binder in the coated powder layer, and the binder is water-soluble.

To solve this problem, a process for fixing the coated powder layer through contact with ammonia, etc. was also proposed, but the fixation by the proposed process has such a disadvantage that even the unexposed part is fixed thereby. That is, when ammonia fixation is carried out after the application of phosphor layer of first color in the production of color picture tube, the secondly exposed part has a lower ability to accept the powder of phosphor of second color, and only a very small amount of the phosphor is attached thereto, or no phosphor is attached at all. Thus, the ammonia fixation must be carried out after the phosphors of three colors have been all attached thereto. However, in that case, such a problem as color contamination appears. That is, when the second light exposure and application of the phosphor of second color are carried out before the phosphor of first color is sufficiently attached, a small amount of the phosphor of second color is attached to the position to which the phosphor of first color is to be attached, because of the still remaining ability of that position to accept the powder, and a color contamination develops. It was found that the color contamination could be prevented by sufficiently attaching the phosphor of first color thereto, etc., but it took much time in operation.

LIST OF THE PRIOR ART

The following reference is cited to show the state of the art.

Japanese Laid-open Patent Application No. 47-7,266. According to the process disclosed in this Japanese application, an emission screen support is coated with a photosensitive lacquer layer which is sticky when not exposed to light and which loses its stickiness upon exposure, parts of the photosensitive lacquer layer not to be provided with emission surfaces are exposed to light, then a light-absorbing material powder which is to be deposited on the unexposed parts is applied onto the layer, the light-absorbing material is removed from the exposed parts by washing, and finally a phosphor surface capable of emitting light of different colors is provided.

However, once the exposed parts of the photosensitive lacquer layer lose their stickiness, it is impossible to coat three phosphors onto the same parts of the photosensitive lacquer layer successively. Consequently, this process is only a process for forming a light-absorbing material layer (a so-called black matrix).

SUMMARY OF THE INVENTION

An object of the present invention is to provide an improved process for forming a patternwise coated powder layer.

Another object of the present invention is to provide a process for ensuring fixation of a powder at each application of the powder.

Another object of the present invention is to provide a process for forming a phosphor screen of a color picture tube wherein the powder is a phosphor material.

These objects can be attained by a process for forming a patternwise coated powder layer on a substrate surface, which comprises (1) a first step of applying to a substrate surface a thin layer of an aromatic diazonium salt or a photo-sensitive composition containing an aromatic diazonium salt as a photo-sensitive component capable of becoming sticky by light exposure, (2) a second step of subjecting the thin layer to a patternwise light exposure, thereby making the light-exposed part sticky, (3) a third step of placing the thin layer after the light exposure in contact with powdery grains, thereby making the thin layer accept the powdery grains according to an ability of the thin layer to accept the powdery grains, and forming a powder-containing layer, and (4) a fourth step of bringing the powder containing coating layer in contact with a powdery material reacting with a photolytic product of the aromatic diazonium salt, thereby forming a water-insoluble or slightly water soluble material. It is possible to carry out steps (3) and (4) at substantially the same time.

DESCRIPTION OF THE PREFERRED EMBODIMENTS

The present invention is characterized by mixing a powdery material capable of reacting with a product of a photolytic reaction of an aromatic diazonium salt, for example, zinc chloride, and capable of forming a water-insoluble or slightly water-soluble solid material with a powder to be coated, by applying the powdery material to the surface of a powder-containing coating layer of the powder to be coated, thereby converting a portion or all of the zinc chloride to a water-insoluble or slightly water-soluble solid material and making the powder-containing coating layer non-sticky, and thereby forming a mechanically strong and water washing-resistant powder-containing coating layer.

The present invention will be described below in detail, referring to the accompanying drawings.

The present invention is carried out through a series of steps shown by FIG. 1A, FIG. 1B, FIG. 1C, FIG. 1D, and FIG. 1E, or FIG. 1A, FIG. 1B, FIG. 1C, FIG. 1F, FIG. 1G and FIG. 1H.

Figure 1A:
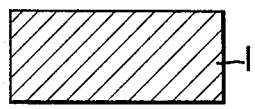
FIG. 1A, FIG. 1B, FIG. 1C, FIG. 1D, FIG. 1E, FIG. 1F, FIG. 1G, and FIG. 1H are drawings showing cross-sections of powder coating layer according to the present invention.
Figure 1E:
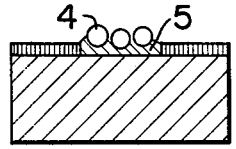
Figure 1B:

Description will be made, referring to the process based on the former series of steps. As shown in FIG. 1A and 1B, a film 2 of photo-sensitive composition is formed on a substrate 1, and is patternwise exposed to light, as shown in FIG. 1C. The exposed part 2' becomes sticky due to formation of zinc chloride. A mixture of a powdery material 3 to be reacted with zinc chloride and a powdery grain material 4 to be coated is applied thereto, as shown in FIG. 1D. Reaction takes place between zinc chloride and the powdery material that reacts with zinc chloride, and as a result a solid material 5 is formed, as shown in FIG. 1E, making the part 2' non-sticky and also strongly fixing the powdery grains 4 to the substrate.

Figure 1F:
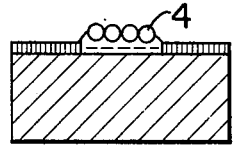
Figure 1C:
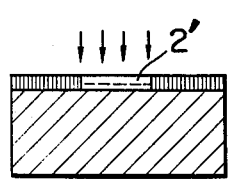
Figure 1G:
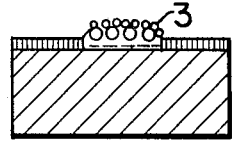
Figure 1D:
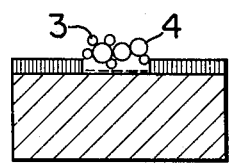
Figure 1H:
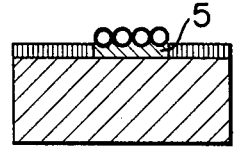

According to a series of the steps heretofore described, a coating layer of the powder 4 is formed, as shown in FIG. 1F, and then the powdery material 3 that reacts with zinc chloride is applied thereto, as shown in FIG. 1G and reacts with deliquescent zinc chloride, thereby forming the solid material 5 and making the exposed part non-sticky, and also thereby strongly fixing the powdery grains to the substrate by means of the solid material, as shown in FIG. 1H.

It is preferable to conduct the fixation during each application of the phosphors of three colors in the production of a phosphor screen of a color picture tube. However, one fixation by conducting the steps of FIG. 1G and FIG. 1H after the application of the phosphors of three colors; that is, after the steps of FIG. 1C and FIG. 1F have been carried out for all the phosphors of three colors; is also included in the present invention. Since some of surface-treated phosphors can reach a sufficient powder coating amount in a relatively short coating time, the resulting powder-containing coating layer has no chance of color contamination. Thus, only one or two fixations can be carried out in the present invention by using such surface-treated phosphor, for example, at the first color and/or second color phosphor application.

A mechanically strong and water-washing-withstanding powder-containing coating layer can be formed according to any of the variations of the present process.

The powdery material reacting with a photolytic reaction product of the aromatic diazonium salt to form a water-insoluble or slightly water-soluble material can be selected in view of the aromatic diazonium salt to be used.

The aromatic diazonium salt capable of becoming sticky by light exposure is disclosed in the Japanese Laid-open Patent Application No. 53-126861, and an aromatic diazonium chloride zinc chloride double salt is one example thereof, which can form zinc chloride in a photolytic reaction. Such compounds includes, for example:

4-dimethylaminobenzenediazonium-(1)-chloride-zinc chloride double salt [$(CH_3)_2NC_6H_4N_2Cl.ZnCl_2$], 4-diethylaminobenzenediazonium-(1)-chloride-zinc chloride double salt, 4-(N-ethyl-N-hydroxyethylamino)-benzenediazonium-(1)-chloride-zinc chloride double salt, Anthraquinonediazonium-(1)-chloride-zinc chloride double salt, 2-methoxy-4-nitrobenzenediazonium-(1)-chloride-zinc chloride double salt, 4-nitronaphthalenediazonium-(1)-chloride-zinc chloride double salt, 4-methoxybenzenediazonium-(1)-chloride-zinc chloride double salt, 2-methoxybenzenediazonium-(1)-chloride-zinc chloride double salt, etc.

Examples of powdery solid materials reacting with zinc chloride, which is a photolytic reaction product of said aromatic diazonium salts, in an aqueous solution, thereby forming a water-insoluble or slightly water-soluble material include alkali hydroxides, alkaline earth hydroxides, alkali oxides, alkaline earth oxides, alkali peroxides, alkaline earth peroxides, alkali carbonates, alkali bicarbonates, ammonium carbonate, alkaline borates. alkali silicates, alkali chromates, ammonium chromate, alkali phosphates, ammonium phosphate, alkali sulfides, ammonium sulfide, alkali ferrocyanides, alkali oxalates, ammonium oxalate, and alkali salts of higher fatty acids, for example, alkali oleates, alkali stearates, etc.

Among the foregoing materials, those which are readily pulverized into fine powders and are stable in the air are particularly preferable, and they are, for example, calcium hydroxide, sodium hydrogen carbonate, sodium carbonate, sodium oxalate, ammonium oxalate, etc.

As other aromatic diazonium salts, aromatic diazonium acidic sulfates can be mentioned, and include, for example:

4-dimethylaminobenzenediazonium-(1) hydrogen sulfate, 4-diethylaminobenzenediazonium-(1) hydrogen sulfate, 4-(phenylamido)-benzenediazonium-(1) hydrogen sulfate, etc.

Examples of powdery solid materials reacting with sufuric acid, which is a photolytic reaction product of said aromatic diazonium compounds in an aqueous solution, thereby forming a water-insoluble or slightly water-soluble material include alkaline earth hydroxides, alkaline earth oxides, alkaline earth carbonates, nitrates, acetates, chloride, etc.

Among the foregoing materials, those which are readily pulverized into fine powders and are stable in the air are particularly preferable, and they are, for example, calcium hydroxide, calcium carbonate, calcium acetate, etc.

The photo-sensitive composition used in the present invention contains 0.5–500% by weight, preferably 1–50% by weight of an organic polymer compound, on the basis of the aromatic diazonium salt, to improve the coatability of the resulting coating material, etc., as disclosed in the Japanese Laid-open Patent Application No. 53-126861. As such organic polymer compound, at least one of organic polymer compounds selected from the group consisting of gum arabic, polyvinyl alcohol, polyacrylamide, poly(N-vinylpyrrolidone), acrylamide-diacetone acrylamide copolymer, methylvinyl ether-maleic anhydride copolymer, alginic acid, propylene glycol ester of alginic acid, and hydroxylpropylmethyl cellulose can be used.

Furthermore, the photo-sensitive composition used in the present invention can contain various surfactants to improve the coatability of the resulting coating material. It is well known to add a surfactant to a coating material for that purpose, and the surfactant used in such well known processes can be also used in the present invention. A preferable amount of the surfactant to be added is about 0.01-about 1% by weight on the basis of the aromatic diazonium salt.

The Japanese Laid-open Patent Application 53-126861 also discloses a method for coating more powder on the thin layer, where the powder is coated on the thin layer, the powder-coated thin layer is then brought in contact with vapors of alcohols or ketones, such as isopropyl alcohol, ethanol, acetone, methylethyleketone, etc., the powder-coated layer is then dried, and the same powder as the initially coated powder is once more coated on the powder-coated layer. The present invention includes such a method. That is, the step of FIG. 1F includes the case of merely coating the powder on the thin layer as well as the case of once coating the powder on the thin layer and then coating more powder thereon according to the method.

In the present invention, it is desirable to apply the powdery material reacting with deliquenscent zinc chloride, thereby forming water-insoluble or slightly water-soluble solid material, then to bring the coating layer to a wet state by contacting it with a highly humid air, etc., and then to dry it, because the reaction between the powdery material and zinc chloride can rapidly proceed in the wet state.

The present invention will be described in detail below, referring to the following Examples.

EXAMPLE 1

An aqueous solution containing the following composition (1) was coated on a glass plate by spin coating at 500 rpm, and dried by infra-red irradiation heating, whereby a photo-sensitive thin layer having a thickness of about 0.2 $\mu$m was formed.

| Composition (1) | |
|---|---|
| 4-dimethylaminobenzenediazonium-(1)-chloride-zinc chloride double salt | 1 part by weight |
| Polyvinyl alcohol (Kurare Poval 224, trade marke of a product made by Kurare Company, Ltd, Japan, mean degree of polymerization: 2,400; hydrolysis ratio: 88%) | 0.1 part by weight |
| Water | 24 parts by weight |

The resulting photo-sensitive thin layer was exposed to a light having an intensity of 50 mW/cm$^2$ from a super high pressure mercury lamp through apertures of a shadow mask for color picture tube for 30 seconds. Then, blue-light emitting phosphor powder for color picture tube was coated on the surface of the photo-sensitive thin layer by dusting method. That is, the phosphor powder was sprayed onto the surface of the thin layer to attach the phosphor powder to the light-exposed part of the thin layer, and the excess phosphor powder was removed therefrom by air spraying.

Then, fine powder of sodium hydrogen carbonate was coated onto the surface of the photo-sensitive thin layer and the phosphor-coated layer by a dusting method, and then the excess powder was removed therefrom by air spraying. The fine powder of sodium hydrogen carbonate used above was prepared in the following manner. That is, 2.0 g of sodium hydrogen carbonate was dissolved in 23.0 g of water, and admixed with 50 ml of absolute ethanol while stirring the solution. The resulting precipitate was filtered off, and dried over anhydrous calcium chloride, whereby fine powder of sodium hydrogen carbonate was obtained.

Then, the air saturated with water vapor at 40° C. was brought in contact with the powder-coated layer to bring the coated layer into a wet state, and then the wet powder-coated layer was left standing in air to effect spontaneous drying of the layer.

A phosphor coating layer strongly fixed to the glass substrate was thus obtained. The phosphor coating layer showed a sufficient resistance to water washing by a running water stream. The same result was obtained also without any contact with the air saturated with water vapor but by leaving the layer standing in air for about 20 minutes.

Even when another color light-emitting phosphor was coated on said phosphor coating layer, the former phosphor was not further coated thereon, and the problem of color contamination was not observed.

On the other hand, a phosphor coating layer obtained in the same manner as above except that the dusting of sodium hydrogen carbonate was not carried out could not withstand the water washing by a running water stream, and was completely peeled off by the water washing.

EXAMPLE 2

A photo-sensitive thin layer was formed on a glass substrate from quite the same composition as in Example 1, by the same spin coating and subjected to the same light exposure as in Example 1.

Then, a phosphor composition having the following composition (2) was coated on the surface of the photosensitive thin layer by the same dusting method as in Example 1.

| Composition (2) | |
|---|---|
| Blue light-emitting phosphor for color picture tube | 1 part by weight |
| Fine powder of sodium hydrogen carbonate (as obtained according to the method shown in Example 1) | 0.06 parts by weight |

A mixed powder coating layer of the phosphor and sodium hydrogen carbonate at the light-exposed part of the photo-sensitive thin film was formed by said operation.

Then, the resulting powder coating layer was brought into a wet state in the same manner as in Example 1, and then dried, whereby a powder coating layer strongly fixed to the glass substrate was obtained.

It was confirmed that the powder coating layer had a sufficient resistance to water washing by running water stream.

EXAMPLE 3

A powder-containing coating layer was formed on a glass substrate from the same composition and phosphor in the same manner as in Example 1, except that (1) sodium carbonate powder, (2) calcium hydroxide powder or (3) sodium oxalate powder was used in place of the sodium hydrogen carbonate in Example 1. The resulting powder-containing coating layer formed when any of powder (1), (2) and (3) was used had a sufficient resistance to water washing by a running water stream.

Sodium carbonate powder (1) was prepared by heating the sodium hydrogen carbonate prepared in the method in Example 1 at 220° C. in air for 30 minutes. Calcium hydroxide powder (2) was a commercially available reagent, and sodium oxalate powder (3) was a commercially available reagent, which was sufficiently finely pulverized in an agate mortar.

EXAMPLE 4

A powder-containing coating layer was formed from quite the same materials in the same manner as in Example 2 except that the following composition (3), (4) or (5) was used in place of the composition (2) of Example 2. It was confirmed that the powder-containing coating layer having a sufficient resistance to water washing by running water stream was obtained when any composition (3), (4) or (5) was used.

| Composition (3) | |
|---|---|
| Blue light-emitting phosphor for color picture tube | 1 part by weight |
| Sodium carbonate powder (the same as used in Example 3) | 0.05 parts by weight |
| Composition (4) | |
| Blue light-emitting phosphor for color picture tube | 1 part by weight |
| Calcium hydroxide powder | 0.05 parts by weight |
| Composition (5) | |
| Blue light-emitting phosphor for color picture tube | 1 part by weight |
| Sodium oxalate powder (pulverized in an agate mortar) | 0.05 parts by weight |

Almost equal results were obtained by replacing sodium oxalate with ammonium phosphate, or others.

EXAMPLE 5

A photo-sensitive thin layer was formed with the following composition (6) in place of the composition (1) in Example 1, and then the same result was obtained with the following composition (7) in place of the composition (2) in Example 2.

| Composition (6) | |
|---|---|
| 4-(diazodiphenylamido)benzenediazonium-(1) hydrogen sulfate | 1 part by weight |
| Gum arabic | 3 parts by weight |
| Water | 60 parts by weight |
| Composition (7) | |
| Blue light-emitting phosphor for color picture tube | 1 part by weight |
| Calcium hydroxide | 0.1 part by weight |

Almost equal results were obtained by replacing calcium hydroxide with others.

The same results were obtained by using a green light or a red light-emitting phosphor in place of the blue light-emitting phosphor successively in the same manner as above.

What is claimed is:

1. a process for forming a patternwise coated powder layer on a substrate surface, which comprises:
    (1) a first step of applying to a substrate surface a thin layer of an aromatic diazonium salt or a photosensitive composition containing an aromatic diazonium salt as a photosensitive component capable of becoming sticky due to the formation of a photolytic reaction product of said salt by light exposure,
    (2) a second step of subjecting the thin layer to patternwise light exposure, thereby forming the photolytic reaction product in the light-exposed parts and making the light-exposed parts sticky,
    (3) a third step of contacting the light-exposed thin layer with powdery grains, thereby making the thin layer accept the powdery grains according to the ability of the sticky light-exposed parts of the thin layer to accept the powdery grains and forming a powder-containing coating layer, and
    (4) a fourth step of contacting the powder-containing coating layer with a powdery material which reacts with the photolytic reaction product of the aromatic diazonium salt to form a water-insoluble non-sticky material or slightly water-soluble non-sticky solid material thereby fixing the powdery grains to the substrate.

2. A process according to claim 1, wherein the aromatic diazonium salt is an aromatic diazonium chloride-zinc chloride double salt, and the powdery material is at least one of the materials selected from the group consisting of alkali hydroxides, alkaline earth hydroxides, alkali oxides, alkaline earth oxides, alkali peroxides, alkaline earth peroxides, alkali carbonates, alkali bicarbonates, ammonium carbonate, alkali borates, alkali silicates, alkali chromates, ammonium chromate, alkali phosphates ammonium phosphate, alkali sulfides, ammonium sulfide, alkali ferrocyanides, alkali oxaltes, ammonium oxalate, and alkali salts of higher fatty acids.

3. A process according to claim 1, wherein the aromatic diazonium salt is an aromatic diazonium acidic sulfate, and the powdery material is at least one of materials selected from the group consisting of alkaline earth hydroxides, alkaline earth oxides, and alkaline earth carbonates, nitrates, acetates and chlorides.

4. A process according to any one of claims 1 to 3, wherein the third step and the fourth step are carried out substantially at the same time.

5. A process according to any one of claims 1 to 3, wherein after the contacting of the powdery material with the powder-containing coating layer in the fourth step, the powder-containing coating layer is exposed to a highly humid air to accelerate the formation of the water-insoluble or slightly water-soluble solid material and is then dried.

6. A process according to any one of claims 1 to 3, wherein the third step and the fourth step are carried out at substantially the same time, and thereafter the powder-containing coating layer is exposed to a highly humid air to accelerate the formation of the water-insoluble or slightly soluble solid material and is then dried.

7. A process according to claim 1, wherein the third step further includes contacting the powder-containing layer with vapors of a compound selected from the group consisting of alcohols and ketones, drying the powder-containing coating layer and contacting the dried powder-containing coating layer with more of the same said powdery grains.

8. A process for forming a phosphor screen of color picture tube, which comprises:
(1) a step of applying to a face plate of a color picture tube a thin layer of a photosensitive composition containing an aromatic diazonium salt as a photosensitive component capable of becoming sticky due to the formation of a photolytic reaction product of said salt by light exposure,
(2) a step of exposing first positions of the thin layer to light through a shadow mask, thereby forming the photolytic reaction product in the first positions and making the light-exposed first positions sticky,
(3) a step of contacting the light-exposed thin layer with a first phosphor powder of a first color, thereby attaching the phosphor to the first light-exposed positions and forming a coating layer containing the first phosphor, and removing excess first phosphor from the thin layer,
(4) a step of contacting the coating layer containing the first phosphor with a powdery material which reacts with the photolytic product of the aromatic diazonium salt, thereby forming a water-insoluble or slightly water-soluble non-sticky solid material in the first positions to fix the first phosphor to the substrate, and removing excess powdery material from the thin layer,
(5) a step of exposing second positions of the thin layer to light through a shadow mask, thereby forming the photolytic reaction product in the second exposed positions and making the second light-exposed positions sticky,
(6) a step of contacting the light-exposed thin layer with a second phosphor powder of a second color, thereby attaching the second phosphor to the second light-exposed positions and forming a coating layer containing the first and second phosphors, and removing excess second phosphor from the thin layer,
(7) a step of contacting the coating layer containing the phosphors with a powdery material which reacts with the photolytic product of the aromatic diazonium salt, thereby forming a water-insoluble or slightly water-soluble non-sticky solid material in the second positions to fix the second phosphor to the substrate, and removing excess powdery material from the thin layer,
(8) a step of exposing third positions of the thin layer to light through a shadow mask, thereby forming the photolytic reaction product in the third exposed positions and making the third light-exposed positions sticky,
(9) a step of contacting the light-exposed thin layer with a third phosphor powder of a third color, thereby attaching the third phosphor to the third light-exposed positions and forming a coating layer containing the first, second and third phosphors, and removing excess third phosphor from the thin layer, and
(10) a step of contacting the coating layer containing the phosphors with a powdery material which reacts with the photolytic product of the aromatic diazonium salt, thereby forming a water-insoluble or slightly water-soluble non-sticky solid material in the third positions to fix the third phosphor to the substrate, and removing excess powdery material from the thin layer.

9. A process according to claim 8, wherein at least one of the pairs of steps (3)–(4), (6)–(7) and (9)–(10) is effected at substantially the same time by contacting the respective light-exposed positions with a mixture of the respective phosphor and powdery material.

10. A process according to claim 1, 2 or 8, wherein the aromatic diazonium salt is an aromatic diazonium chloride-zinc chloride double salt selected from the group consisting of 4-dimethylaminobenzenediazonium-(1)-chloride-zinc chloride double salt, 4-diethylaminobenzenediazonium-(1)-chloride-zinc chloride double salt, 4-(N-ethyl-N-hydroxyethylamino)-benzenediazonium-(1)-chloride-zinc chloride double salt, anthraquinonediazonium-(1)-chloride-zinc chloride double salt, 2-methoxy-4-nitrobenzenediazonium-(1)-chloride-zinc chloride double salt, 4-nitronaphthalenediazonium-(1)-chloride-zinc chloride double salt, 4-methoxybenzenediazonium-(1)-chloride-zinc chloride double salt and 2-methoxybenzenediazonium-(1)-chloride-zinc chloride double salt.

11. A process according to claim 1, 3 or 8, wherein the aromatic diazonium salt is an aromatic diazonium acidic sulfate selected from the group consisting of 4-dimethylaminobenzenediazonium-(1) hydrogen sulfate, 4-diethylaminobenzenediazonium-(1) hydrogen sulfate and 4-(phenylamido)-benzenediazonium-(1) hydrogen sulfate.

12. A process according to claim 1 or 8, wherein the photosensitive composition contains an organic polymer compound in an amount of 0.5–500 weight percent on the basis of the aromatic diazonium salt.

13. A process according to claim 12, wherein the organic polymer compound is selected from the group consisting of gum arabic, polyvinyl alcohol, polyacrylamide, poly(N-vinylpyrrolidone), acrylamide-diacetone acrylamide copolymer, methylvinyl ether-maleic anhydride copolymer, alginic acid, propylene glycol ester of alginic acid and hydroxylpropylmethyl cellulose.

14. A process according to claim 13, where the amount of organic polymer compound is 1–50 weight percent on the basis of the aromatic diazonium salt.

15. As process according to claim 1 or 8, wherein the photosensitive composition contains a surfactant.

16. A process according to claim 15, wherein the surfactant is present in an amount from about 0.01 to about 1 weight percent on the basis of the aromatic diazonium salt.

* * * * *